(12) United States Patent
Yamasaki et al.

(10) Patent No.: US 6,924,223 B2
(45) Date of Patent: Aug. 2, 2005

(54) METHOD OF FORMING A METAL LAYER USING AN INTERMITTENT PRECURSOR GAS FLOW PROCESS

(75) Inventors: Hideaki Yamasaki, Kofu (JP); Tsukasa Matsuda, Yamanashi (JP); Atsushi Gomi, Yamanashi (JP); Tatsuo Hatano, Ryuo (JP); Mitsuhiro Tachibana, Nakakoma-gun (JP); Koumei Matsuzava, Nirasaki (JP); Yumiko Kawano, Kofu (JP); Gert J Leusink, Saltpoint, NY (US); Fenton R McFeely, Ossining, NY (US); Sandra G. Malhotra, Beacon, NY (US); Andrew H Simon, Fishkill, NY (US); John J Yurkas, Stamford, CT (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/673,646

(22) Filed: Sep. 30, 2003

(65) Prior Publication Data

US 2005/0069632 A1 Mar. 31, 2005

(51) Int. Cl.[7] .............................................. H01L 21/44
(52) U.S. Cl. ....................... 438/622; 438/681; 438/648; 438/656; 438/685
(58) Field of Search ................................ 438/680–681, 438/622, 648, 656, 685

(56) References Cited

U.S. PATENT DOCUMENTS

| | | |
|---|---|---|
| 5,306,666 A | 4/1994 | Izumi |
| 5,916,365 A | 6/1999 | Sherman |
| 6,451,695 B2 | 9/2002 | Sneh |
| 6,475,910 B1 | 11/2002 | Sneh |
| 6,511,539 B1 | 1/2003 | Raaijmakers |
| 6,511,867 B2 | 1/2003 | Lowrey et al. |
| 6,551,929 B1 | 4/2003 | Kori et al. |
| 6,616,986 B2 | 9/2003 | Sherman |
| 6,635,965 B1 | 10/2003 | Lee et al. |
| 2002/0066411 A1 | 6/2002 | Chiang et al. |
| 2002/0187256 A1 | 12/2002 | Elers et al. |
| 2002/0192953 A1 | 12/2002 | Wang et al. |
| 2003/0013300 A1 | 1/2003 | Byun |
| 2003/0104126 A1 | 6/2003 | Fang et al. |
| 2003/0124787 A1 | 7/2003 | Wang et al. |
| 2003/0157760 A1 | 8/2003 | XI et al. |
| 2003/0190802 A1 | 10/2003 | Wang et al. |
| 2003/0203616 A1 | 10/2003 | Chung et al. |
| 2004/0014315 A1 * | 1/2004 | Lai et al. ..................... 438/680 |
| 2004/0121596 A1 * | 6/2004 | Pan et al. ..................... 438/680 |

FOREIGN PATENT DOCUMENTS

| | | |
|---|---|---|
| WO | WO 03/009360 A2 | 1/2003 |
| WO | WO 03/016588 A1 | 2/2003 |
| WO | WO 03/029515 A2 | 4/2003 |
| WO | WO 2004/042112 A1 | 5/2004 |

OTHER PUBLICATIONS

Klaus, J.W. et al., "Atomic layer deposition of tungsten using sequential surface chemistry with a sacrificial stripping action, " Thin Solid Films, Elsevier–Sequoia S.A. (Lausame, Switzerland), vol. 360 (No. 1–2), p. 145–153, (Feb. 2000).

* cited by examiner

Primary Examiner—Thanh Nguyen
(74) Attorney, Agent, or Firm—Pillsbury Winthrop Shaw Pittman LLP (57) ABSTRACT

A method is provided for forming a metal layer on a substrate using an intermittent precursor gas flow process. The method includes exposing the substrate to a reducing gas while exposing the substrate to pulses of a metal-carbonyl precursor gas. The process is carried out until a metal layer with desired thickness is formed on the substrate. The metal layer can be formed on a substrate, or alternately, the metal layer can be formed on a metal nucleation layer.

53 Claims, 4 Drawing Sheets

METHOD OF FORMING A METAL LAYER USING AN INTERMITTENT PRECURSOR GAS FLOW PROCESS

FIELD OF THE INVENTION

The present invention relates to semiconductor processing, and more particularly, to a method for forming metal layers from thermal decomposition of a metal-carbonyl precursor in an intermittent precursor gas flow process.

BACKGROUND OF THE INVENTION

The introduction of copper (Cu) metal into multilayer metallization schemes for manufacturing integrated circuits, can require the use diffusion barriers/liners to promote adhesion and growth of the Cu layers, and to chemically isolate the Cu from the dielectric material to prevent diffusion of Cu into the dielectric material.

Barriers/liners that are deposited onto dielectric materials can include refractive materials such as tungsten (W), molybdenum (Mo), and tantalum (Ta), that are non-reactive and immiscible with Cu and can offer low electrical resistivity. Basic material properties of W, such as electrical resistivity, thermal stability, and diffusion barrier properties make W layers suitable for use in advanced Cu-based interconnect applications. Current integration schemes that integrate Cu metallization and dielectric materials can require W barrier/liner deposition processes at substrate temperatures between about 400° C. and about 500° C., or lower.

W layers can be formed on a substrate in a thermal chemical vapor deposition (TCVD) process by thermally decomposing a tungsten-halide precursor, e.g., tungsten hexafluoride ($WF_6$), in the presence of a reducing gas such as hydrogen or silane. A drawback to using tungsten-halide precursors is incorporation of halide by-products in the W layer that can degrade the material properties of the W layer. A non-halogen containing tungsten precursor, such as a tungsten-carbonyl precursor, can be used to alleviate the abovementioned drawbacks associated with tungsten-halide precursors. However, material properties of W layers that are formed by thermal decomposition of tungsten-carbonyl precursors (e.g., $W(CO)_6$), can deteriorate due to incorporation of CO reaction by-products into the thermally deposited W layers, resulting in increase in the electrical resistivity of the W layers and formation of W layers with poor conformality.

SUMMARY OF THE INVENTION

A method is provided for forming a metal layer on a substrate by providing a substrate in a process chamber, exposing the substrate to a reducing gas, exposing the substrate to a pulse of a metal-carbonyl precursor gas, thereby forming a metal layer on the substrate, and repeating the exposing processes until a metal layer with a desired thickness is formed.

In another embodiment, a method is provided for forming a metal layer on a substrate containing a plurality of microstructures by providing a substrate in a process chamber, exposing the substrate to a reducing gas, exposing the substrate to a pulse of a metal-carbonyl precursor gas, thereby forming a metal layer on the substrate, and repeating the exposing processes until a metal layer with a desired thickness is formed. The method comprises forming a metal layer having a first thickness on the bottom of at least one microstructure, forming a metal layer having a second thickness on the sidewall of at least one microstructure, and forming a metal layer having an overhang at the top of at least one microstructure.

In one embodiment, the metal layer can be formed on a substrate, or alternately, the metal layer can be formed on a metal nucleation layer.

DETAILED DESCRIPTION OF THE INVENTION

Figure 1:
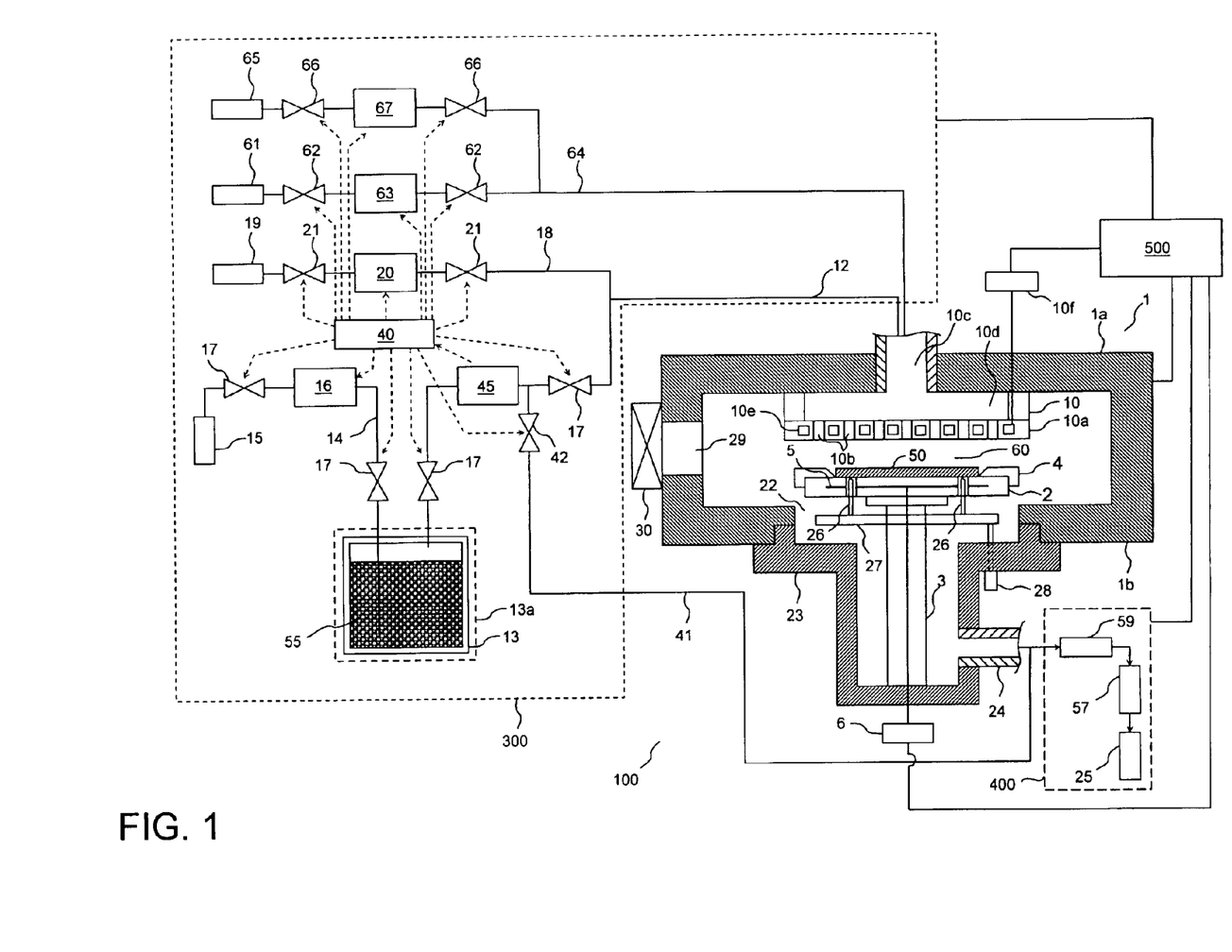
FIG. 1 is a simplified block-diagram of a processing system for forming a metal layer according to an embodiment of the invention.

FIG. 1 is a simplified block-diagram of a processing system for forming a metal layer according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater.

During processing, the heated substrate 50 thermally decomposes a $W(CO)_6$ precursor and enables formation of a W layer on the substrate 50. The substrate holder 2 is heated to a pre-determined temperature that is suitable for depositing the desired W layer onto the substrate 50. A heater (not shown) is embedded in the walls of process chamber 1 to heat the chamber walls to a pre-determined temperature. The heater can maintain the temperature of the walls of process chamber 1 from about 40° C. to about 80° C.

A showerhead 10 is located in the upper chamber section 1a of process chamber 1. Showerhead plate 10a at the bottom of showerhead 10 contains multiple gas delivery holes 10b for delivering a process gas comprising the $W(CO)_6$ precursor gas into a processing zone 60 located above the substrate 50. The processing zone 60 is a volume defined by the substrate diameter and by the gap between the substrate 50 and the showerhead 10.

An opening 10c is provided in the upper chamber section 1b for introducing a process gas from gas line 12 into a gas distribution compartment 10d. Concentric coolant flow channels 10e are provided for controlling the temperature of the showerhead 10 and thereby preventing the decomposition of the W(CO)$_6$ precursor inside the showerhead 10. A coolant fluid such as water, can be supplied to the coolant flow channels 10e from a coolant fluid source 10f for controlling the temperature of showerhead 10 from about 20° C. to about 100° C.

The gas line 12 connects the gas delivery system 300 to process chamber 1. A precursor container 13 contains a solid W(CO)$_6$ precursor 55, and a precursor heater 13a is provided for heating the precursor container 13 to maintain the W(CO)$_6$ precursor 55 at a temperature that produces a desired vapor pressure of the W(CO)$_6$ precursor. The W(CO)$_6$ precursor 55 can have a relatively high vapor pressure, $P_{vap}$~1 Torr at 65° C. Therefore, only moderate heating of the precursor source 13 and the precursor gas delivery lines (e.g., gas line 12) is required for delivering the W(CO)$_6$ precursor gas to the process chamber 1. Furthermore, the W(CO)$_6$ precursor does not thermally decompose at temperatures below about 200° C. This can significantly reduce decomposition of the W(CO)$_6$ precursor due to interactions with heated chamber walls and gas phase reactions.

In one embodiment, W(CO)$_6$ precursor vapor can be delivered to the process chamber 1 without the use of a carrier gas or, alternatively, a carrier gas can be used to enhance the delivery of the precursor to the process chamber 1. Gas line 14 can provide a carrier gas from gas source 15 to the precursor container 13, and a mass flow controller (MFC) 16 can be used to control the carrier gas flow. When a carrier gas is used, it may be introduced into the lower part of precursor container 13 so as to percolated through the solid W(CO)$_6$ precursor 55. Alternatively, the carrier gas may be introduced into the precursor source 13 and distributed across the top of the solid W(CO)$_6$ precursor 55. A sensor 45 is provided for measuring the total gas flow from the precursor container 13. The sensor 45 can, for example, comprise a MFC, and the amount of W(CO)$_6$ precursor delivered to the process chamber 1, can be determined using sensor 45 and mass flow controller 16. Alternatively, the sensor 45 can comprise a light absorption sensor to measure the concentration of the W(CO)$_6$ precursor in the gas flow to the process chamber 1.

A bypass line 41 is located downstream from sensor 45 and connects gas line 12 to exhaust line 24. Bypass line 41 provided for evacuating gas line 12 and for stabilizing the supply of the W(CO)$_6$ precursor to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the W(CO)$_6$ precursor in the gas lines. The temperature of the gas lines can be controlled from about 20° C. to about 100° C., or from about 25° C. to about 60° C.

Dilution gases can be supplied from gas source 19 to gas line 12 using gas line 18. The dilution gases can be used to dilute the process gas or to adjust the process gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the W(CO)$_6$ precursor gas, and a dilution gas. Sensor 45 is also connected to controller 40 and, based on output of the sensor 45, controller 40 can control the carrier gas flow through mass flow controller 16 to obtain the desired W(CO)$_6$ precursor flow to the process chamber 1. A reducing gas can be supplied from gas source 61 to the process chamber 1 using gas line 64, MFC 63, and valves 62. A purge gas can be supplied from gas source 65 to process chamber 1 using gas line 64, MFC 67, and valves 66. Controller 40 can control the supply, shutoff, and the flow of the reducing gas and the purge gas.

Exhaust line 24 connects exhaust chamber 23 to vacuum pumping system 400. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump (TMP) capable of a pumping seed up to about 5000 liters per second (and greater). Alternatively, the vacuum pumping system 400 can include a dry pump. During processing, the process gas can be introduced into the process chamber 1 and the chamber pressure adjusted by the APC 59. The APC 59 can comprise a butterfly-type valve or a gate valve. The trap 57 can collect unreacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below to the upper surface of substrate holder 2. A drive mechanism 28 utilizing, for example, an air cylinder, provides means for raising and lowering the plate 27. A substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 500 includes a microprocessor, a memory, and a digital I/O port capable of generating control voltages sufficient to communicate and activate inputs of the processing system 100 as well as monitor outputs from the processing system 100. Moreover, the processing system controller 500 is coupled to and exchanges information with process chamber 1, gas delivery system 300 that includes controller 40 and precursor heater 13a, vacuum pumping system 400, power source 6, and coolant fluid source 10f. In the vacuum pumping system 400, the processing system controller 500 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 500 is a DELL PRECISION WORKSTATION 610™, available from Dell Corporation, Dallas, Tex.

A processing system for forming W layers can comprise a single wafer process chamber as is schematically shown and described in FIG. 1. Alternatively, the processing system can comprise a batch type process chamber capable of processing multiple substrates (wafers) simultaneously. In addition to semiconductor substrates, e.g., Si wafers, the substrates can, for example, comprise LCD substrates, glass substrates, or compound semiconductor substrates. The process chamber can, for example, process substrates of any size, such as 200 mm substrates, 300 mm substrates, or even larger substrates.

In general, various metal barriers/liners from the corresponding metal-carbonyl precursors can be deposited. This includes deposition of W, Ni, Mo, Co, Rh, Re, Cr, and Ru metal layers from $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$ precursors, respectively.

A metal layer can be thermally deposited from a metal-containing precursor without the use of a reducing gas. Alternately, a reducing agent, e.g. a $H_2$ gas, can be employed to aid in the deposition of the metal layer. Thermal decomposition of a metal-carbonyl precursor and the formation of a metal layer, is thought to proceed predominantly by CO elimination and desorption of CO by-products from the substrate. Incorporation of CO by-products into the metal layer can result from incomplete decomposition of the metal-carbonyl precursor, incomplete removal of adsorbed CO by-products from the metal layer, and re-adsorption of CO by-products in the process chamber onto the metal layer. Incorporation of CO reaction by-products into the metal layer can increase the electrical resistivity of the metal layer and lead to poor surface morphology due to abnormal growth of nodules (metal particles) on the surface of the metal layer and/or in the metal layer.

In one embodiment of the invention, the metal layer is formed during a series of metal-carbonyl precursor gas pulses. Each pulse forms a metal layer which is between about 5 angstrom (A) and about 60 A thick. In another embodiment of the invention, the metal layer formed during each metal-carbonyl precursor gas pulse can be between about 5 A and about 10 A thick. In one embodiment of the invention, the total metal layer thickness is less than about 500 A after a plurality of metal precursor gas pulses. Cyclical processing differs from a conventional chemical vapor deposition (CVD) process which normally is a non-cyclical process, i.e. where a precursor gas is exposed to substrate one time during the deposition process.

Figure 2:
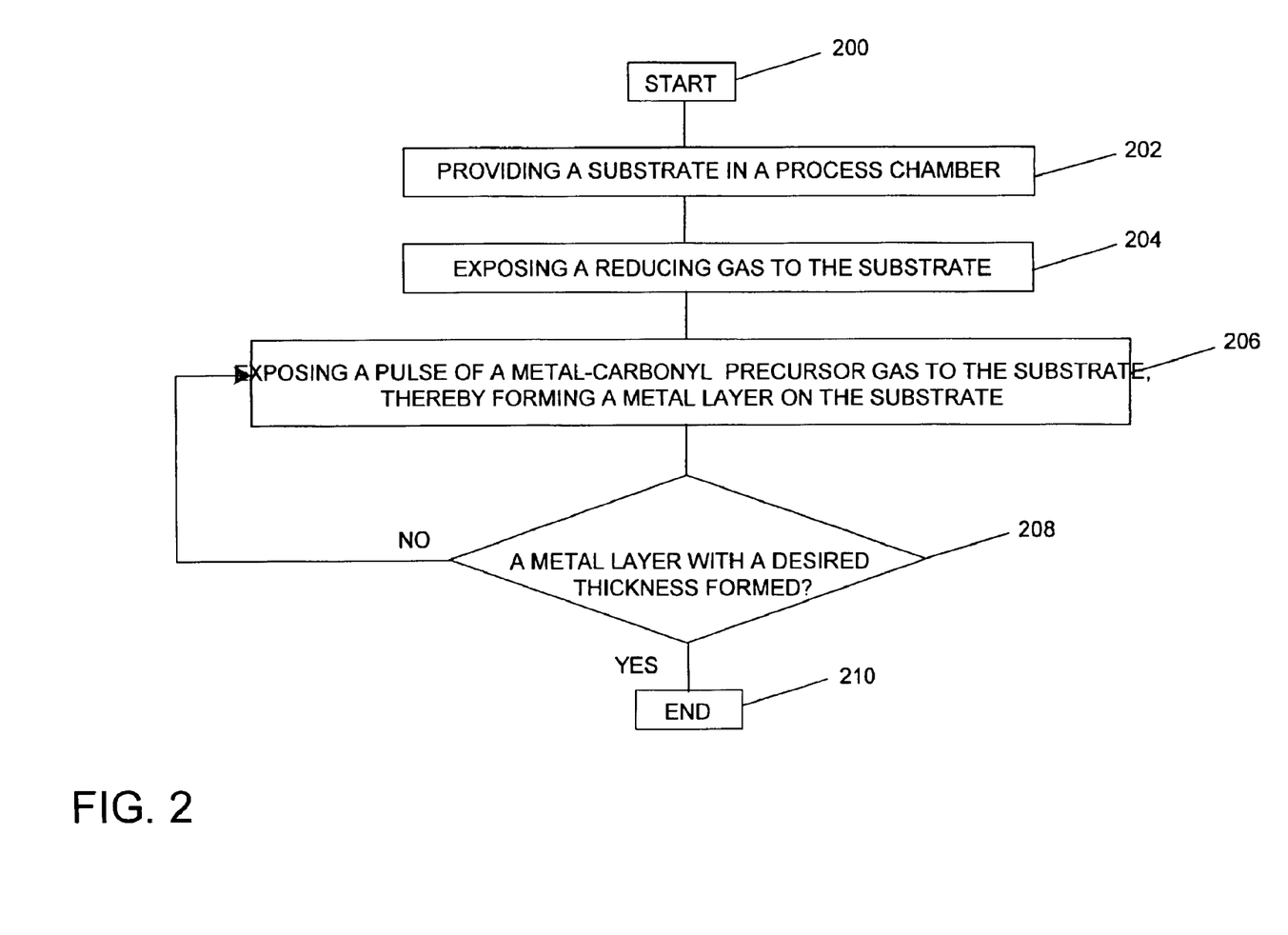
FIG. 2 is a flowchart for forming a metal layer using an intermittent precursor gas flow process according to an embodiment of the invention.

FIG. 2 is a flowchart for forming a metal layer using an intermittent precursor gas flow process according to an embodiment of the invention. At 200, the process is started. At 202, a substrate is provided in a process chamber, and at 204, the substrate is exposed to a reducing gas. At 206, the substrate is exposed to a pulse of a metal-carbonyl precursor gas, thereby forming a metal layer on the substrate from thermal decomposition of the metal-carbonyl precursor gas. At 208, a decision is made whether to end the process. When the desired thickness is achieved, the process ends at 210, and when the desired thickness has not been achieved, the process returns to 206.

Figure 3:
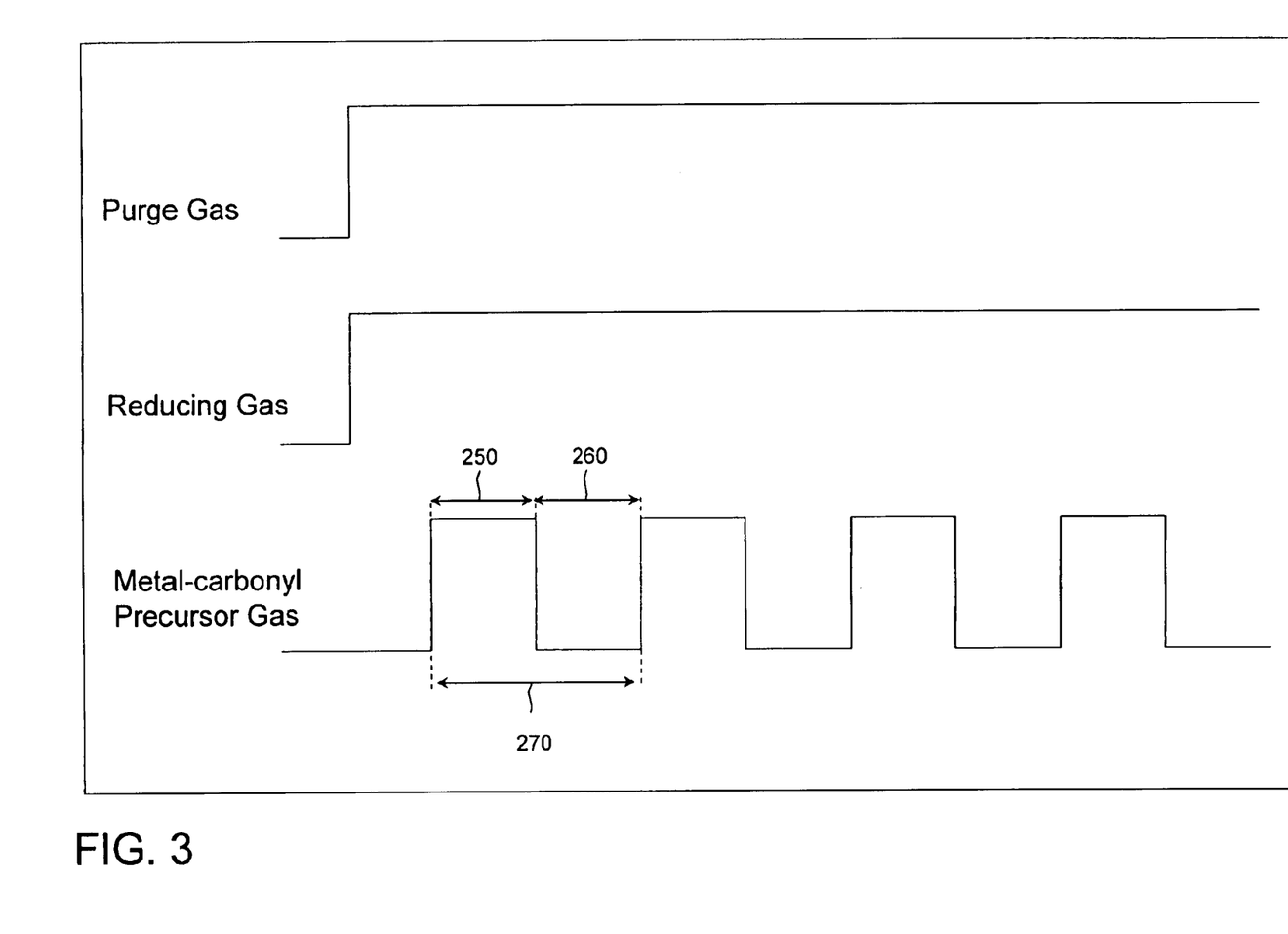
FIG. 3 schematically shows gas flows during an intermittent precursor gas flow process for forming a metal layer according to an embodiment of the invention.

FIG. 3 schematically shows gas flows during an intermittent precursor gas flow process for forming a metal layer according to an embodiment of the invention. In the embodiment illustrated in FIG. 3, a gas flow comprising a reducing gas, e.g., $H_2$, and a purge gas, e.g., Ar, is established in the process chamber. Subsequently, a pulse of a metal-carbonyl precursor gas is flowed into the process chamber for a time period 250. The length of time period 250 can, for example, depend on the reactivity of the metal-carbonyl precursor, dilution of the metal-carbonyl precursor with a carrier gas and dilution gas, and the flow characteristics of the processing system. At the end of time period 250, the process chamber is purged for a time period 260 by the purge gas and the reducing gas. As schematically shown in FIG. 3, the flow rates of the purge gas and the reducing gas can be constant during the process. Alternatively, the flow rates of the purge gas and the reducing gas can be varied during the process.

The metal-carbonyl precursor gas can comprise metal-carbonyl precursor and optionally a carrier gas and a dilution gas. The metal-carbonyl flow rate can, for example, be between about 0.1 sccm and about 200 sccm. The carrier gas, the dilution gas, and the purge gas can, for example, comprise an inert gas such as Ar, He, Kr, Xe, and $N_2$. In one embodiment of the invention, the carrier gas flow rate can be between about 10 sccm and about 1000 sccm, the purge gas flow rate can be between about 50 sccm and about 1000 sccm, and the dilution gas flow rate can be between about 10 sccm and about 1000 sccm.

In general, the reducing gas can comprise a gas that is capable of aiding in the removal of reaction by-products from the metal layer. In one embodiment of the invention, the reducing gas can comprise a hydrogen-containing gas, for example, $H_2$ gas. In another embodiment of the invention, the reducing gas can comprise a silicon-containing gas such as silane ($SiH_4$), disilane ($Si_2H_6$), and dichlorosilane ($SiCl_2H_2$). In yet another embodiment of the invention, the reducing gas can comprise a boron-containing gas, for example a boron-containing gas with the general formula $B_xH_{3x}$. This includes, for example, borane ($BH_3$), diborane ($B_2H_6$), triborane ($B_3H_9$), and others. In still another embodiment of the invention, the reducing gas can comprise a nitrogen-containing gas, for example, ammonia ($NH_3$). In one embodiment of the invention, a flow rate of the reducing gas can be between about 10 sccm and about 500 sccm.

In the embodiment schematically shown in FIG. 3, a deposition cycle 270 consists of time periods 250 and 260. During time period 250, a thin metal layer is formed onto the substrate from thermal decomposition of the metal-carbonyl precursor. During the time period 260, the process chamber is purged by the purge gas and the reducing gas. The deposition cycle 270 can be repeated until a metal layer with a desired thickness is formed on the substrate.

Suitable process conditions that enable formation of a metal layer with desired thickness can be determined by direct experimentation and/or design of experiments (DOE). Adjustable process parameters can, for example, comprise the length of time periods 250, and 260, temperature (e.g., substrate temperature), process pressure, process gases, and relative gas flow rates. The length of each time period 250 and 260, can be independently varied to optimize the thickness and conformality of the metal layer. The length of time periods 250 and 260 can be constant in each deposition cycle, or alternatively, the length of time periods 250 and 260 can independently varied in a deposition cycle 270. In general, the length of time period 250 can be between about 1 sec and about 500 sec, for example about 25 sec, and the length of time period 260 can be less than about 120 sec, for example about 30 sec.

In one embodiment of the invention, the process chamber pressure can, for example, be between about 0.01 Torr and about 5 Torr. In another embodiment of the invention, the process chamber pressure can be less than about 0.2 Torr, and can be about 0.04 Torr. The substrate temperature can be between about 250° C. and about 600° C., or between about 400° C. and about 500° C. The metal-carbonyl precursor in the precursor container can, for example, be kept at a temperature between about 35° C. and about 45° C.

In one embodiment of the invention, a metal nucleation layer can be formed on a substrate prior to forming a metal layer using the intermittent metal-carbonyl precursor gas flow process described above. A metal nucleation layer can be deposited using various well known deposition methods, including but not limited to, CVD, plasma-enhanced CVD (PECVD), and physical vapor deposition (PVD). The thickness of the initial metal nucleation can, for example, be between about 10 A and about 1000 A. In one example, a CVD process for depositing a metal nucleation layer can utilize a metal-carbonyl precursor gas, a process pressure of about 0.5 Torr and an exposure time of about 60 sec.

Figure 4:
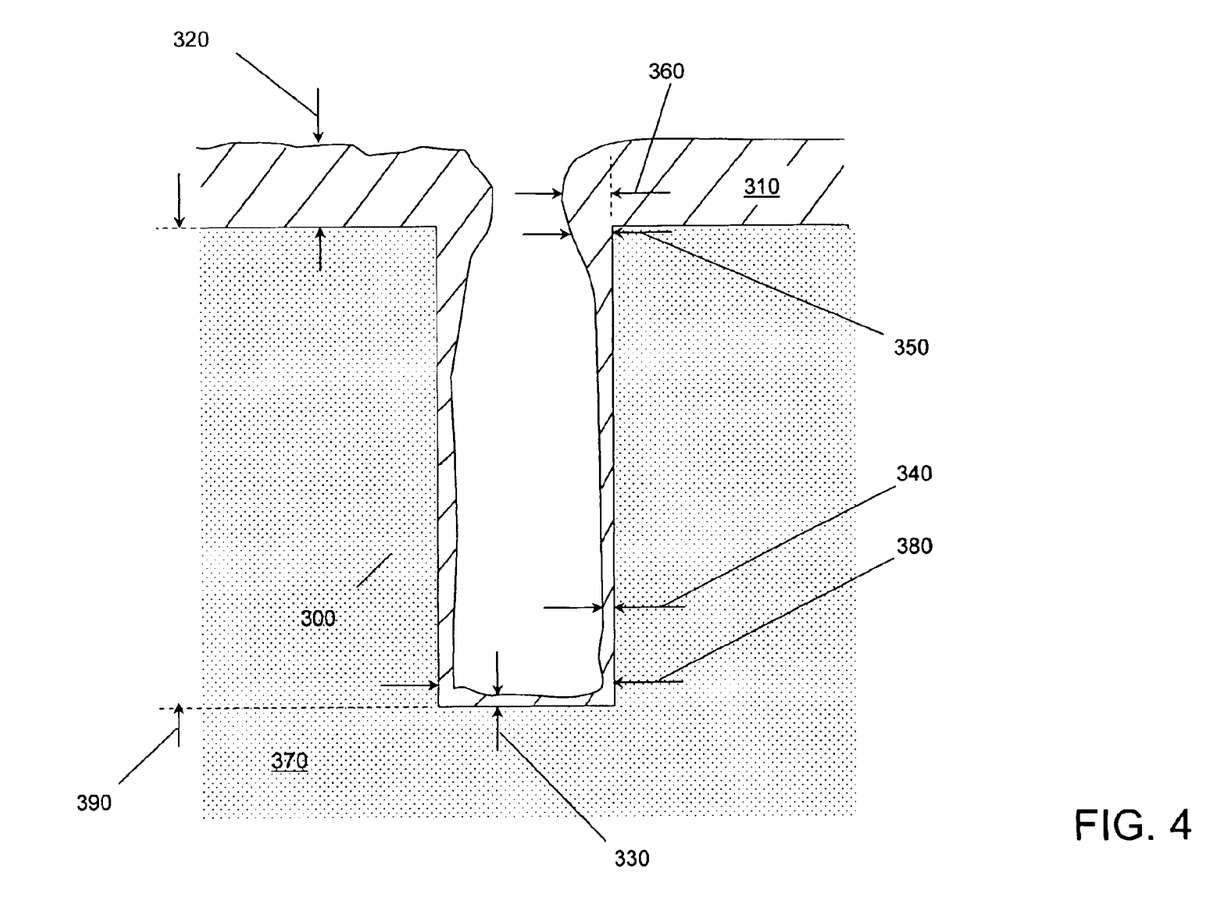
FIG. 4 shows a schematic of a W layer formed on a Si microstructure according to an embodiment of the invention.

FIG. 4 schematically shows a cross-sectional view of a W layer formed on a Si microstructure according to an embodiment of the invention. In FIG. 4, the thickness of the W layer 310 varies across the topography of the microstructure 300 formed on the substrate 370. The microstructure 300 had an aspect ratio of about 3:1 (depth of hole or trench:width of hole or trench). The depth 390 of the holes and trenches was about 1.1 micron (11,000 A), and the average width 380 of the holes and trenches was about 0.36 micron (3,600 A).

TABLE I shows the thickness and conformality of W layers formed on the Si microstructure schematically shown in FIG. 4 according to an embodiment of the invention. In order to evaluate the conformality of the W layer 310 for different processing conditions, the thickness of the W layer 310 at various locations on the microstructure 300 was compared to the thickness 320 of the W layer 310 adjacent to the microstructure 300. This included the thickness 360 of the W layer overhang at the top of the microstructure 300, the thickness 350 of the W layer 310 at the top the opening of the microstructure 300, the thickness 330 of the W layer 310 at the bottom of the microstructure 300, and the minimum thickness 340 of the W layer on the vertical sidewalls of the microstructure 300.

The W layers in TABLE I were formed using the following process conditions: a) a W CVD process at a substrate temperature of about 500° C., b) an intermittent precursor gas flow process at a substrate temperature of about 500° C., and c) an intermittent precursor gas flow process at a substrate temperature of about 400° C. Prior to depositing the W layers according to a)–c), a thin W nucleation layer was deposited on the substrate using a W(CO)$_6$ precursor gas comprising W(CO)$_6$, an Ar carrier gas, and an Ar purge gas. The W nucleation layer was deposited for 60 sec at a process chamber pressure of about 0.5 Torr.

Following formation of a thin W nucleation layer on the substrate, the CVD process a) was carried out at a substrate temperature of about 500° C. by exposing a W(CO)$_6$ gas, an Ar carrier gas, an Ar purge gas, and a H$_2$ reducing gas, to the substrate. The intermittent precursor gas flow processes in (b) and (c) were carried out at substrate temperatures of about 500° C. and about 400° C., respectively, using 120 deposition cycles, a process pressure of about 0.04 Torr, an Ar purge gas, a H$_2$ reducing gas, and a W(CO)$_6$ precursor gas comprising an Ar carrier gas.

TABLE I

| | (a) CVD (500° C.) | | (b) INTERMITTENT PRECURSOR FLOW (500° C.) | | (c) INTERMITTENT PRECURSOR FLOW (400° C.) | |
|---|---|---|---|---|---|---|
| | Hole | Trench | Hole | Trench | Hole | Trench |
| Layer | | | | | | |
| 320 | 2150 A | 2150 A | 1555 A | 1555 A | 2533 A | 2533 A |
| 330 | 195 A | 678 A | 259 A | 781 A | 460 A | 1260 A |
| 340 | 293 A | 684 A | 204 A | 586 A | 364 A | 1151 A |
| 350 | 586 A | 1270 A | 518 A | 977 A | 691 A | 1612 A |
| 360 | 950 A | 1270 A | 690 A | 977 A | 1151 A | 1727 A |
| Ratio | | | | | | |
| 360/320 | 0.44 | 0.59 | 0.44 | 0.63 | 0.45 | 0.68 |
| 330/320 | 0.09 | 0.32 | 0.17 | 0.50 | 0.18 | 0.50 |

TABLE I-continued

| | (a) CVD (500° C.) | | (b) INTERMITTENT PRECURSOR FLOW (500° C.) | | (c) INTERMITTENT PRECURSOR FLOW (400° C.) | |
|---|---|---|---|---|---|---|
| | Hole | Trench | Hole | Trench | Hole | Trench |
| 340/320 | 0.14 | 0.32 | 0.13 | 0.38 | 0.14 | 0.45 |
| GRAIN SIZE (A) | 100–350 A | | 100–150 A | | 300–350 A | |

The results in TABLE I show that the W layers formed by process conditions a)–c) all had similar 360/320 values, indicating similar degree of overhang for the W layers. The intermittent precursor gas flow processes b) and c) yielded better 330/320 values for holes and trenches than the CVD process. In other words, the relative thickness of the W layer 310 on the bottom of the microstructure was significantly improved using the intermittent precursor gas flow process compared to the CVD process. In addition, the 340/320 values for b) and c) were improved for trenches, illustrating better relative sidewall coverage of the W layer 310 using the intermittent precursor gas flow process.

The size of the W grains in the W layer 310 for process conditions a)–c), were visually observed from SEM micrographs. The W formed by the CVD process showed W grains ranging in size from about 100 A to about 350 A, whereas the intermittent precursor gas flow processes b) and c) showed W grains ranging in size from about 100 A to about 150 A for a substrate temperature of about 500° C., and from about 300 A to about 350 A for a substrate temperature of about 400° C. Therefore, W grains formed by the intermittent precursor gas flow process have narrower size distributions than the CVD process.

The substrates can contain a plurality of microstructures. In one embodiment, the width of the microstructures can be less than about 0.4 micron. In another embodiment, it can be less than about 0.15 micron. In yet another embodiment, it can be less than about 0.1 micron. In still another embodiment, the depth of the microstructures can be greater than about 1 micron.

In one embodiment, the aspect ratio of the microstructures can be greater than about 3:1. In another embodiment, a W layer thickness on the bottom of the microstructures can be greater than about 10 A. In still another embodiment, it can be greater than about 50 A. In fact, it can be greater than about 150 A. In one embodiment, a W layer thickness on the sidewall of the microstructures is greater than about 10 A. In another embodiment, it can be greater than about 50 A. In fact, it can be greater than about 150 A.

In one embodiment, the ratio of a metal layer thickness on the bottom of the microstructures and a metal layer thickness adjacent to the microstructures is greater than about 0.1. In another embodiment, the ratio of a metal layer thickness on the sidewall of the microstructures and a metal layer thickness adjacent to the microstructures is greater than about 0.1. In yet another embodiment, the ratio of the thickness of a metal overhang at the top of a microstructure and the thickness of the metal layer adjacent to the microstructure can be less than about 0.7. In still another embodiment, the ratio can be less than about 0.5.

In another example of an intermittent precursor gas flow process, a W layer was formed on a thermally grown SiO$_2$ layer at a substrate temperature of about 400° C. using 60 deposition cycles. The duration of each pulse of the W(CO)$_6$ precursor gas was about 25 sec and the Ar carrier gas flow rate was about 50 sccm. The $H_2$ reducing gas flow rate was about 100 sccm. The W layer formed by the process was about 389 A thick with an average deposition rate of about 6.5 A in each deposition cycle. The electrical resistivity of the W layer was about 34.9 µohm-cm.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a metal layer on a substrate, the method comprising:
   providing a substrate in a process chamber;
   exposing the substrate to a reducing gas at a substantially constant flow rate;
   exposing the substrate to a purge gas at a substantially constant flow rate;
   exposing the substrate to a pulse of a metal-carbonyl precursor, thereby forming a metal layer on the substrate; and
   repeating the exposing processes until a metal layer with a desired thickness is formed.

2. The method according to claim 1, wherein the metal-carbonyl precursor comprises at least one of $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, and $Ru_3(CO)_{12}$.

3. The method according to claim 1, wherein the metal layer comprises at least one of W, Ni, Mo, Co, Rh, Re, Cr, and Ru.

4. The method according to claim 1, wherein the metal-carbonyl precursor gas comprises $W(CO)_6$.

5. The method according to claim 2, wherein a flow rate of metal-carbonyl precursor is between about 0.1 sccm and about 200 sccm.

6. The method according to claim 2, wherein the metal-carbonyl precursor gas further comprises at least one of a carrier gas and a dilution gas.

7. The method according to claim 6, wherein the at least one of a carrier gas and a dilution gas comprises an inert gas.

8. The method according to claim 7, wherein the inert gas comprises at least one of Ar, He, Kr, Xe, and $N_2$.

9. The method according to claim 6, wherein the precursor gas includes a carrier gas having a flow rate between about 10 sccm and about 1000 sccm.

10. The method according to claim 6, wherein the precursor gas includes a dilution gas having a flow rate between about 10 sccm and about 1000 sccm.

11. The method according to claim 1, wherein the reducing gas comprises at least one of a hydrogen-containing gas, a silicon-containing gas, a boron-containing gas, and a nitrogen-containing gas.

12. The method according to claim 11, wherein the reducing gas includes a hydrogen-containing gas comprising $H_2$.

13. The method according to claim 11, wherein the reducing gas includes a silicon-containing gas comprising at least one of $SiH_4$, $Si_2H_6$, and $SiCl_2H_2$.

14. The method according to claim 11, wherein the reducing gas includes a boron-containing gas comprising at least one of $BH_3$, $B_2H_6$, and $B_3H_9$.

15. The method according to claim 11, wherein the reducing gas includes a nitrogen-containing gas comprising $NH_3$.

16. The method according to claim 11, wherein a flow rate of the reducing gas is between about 10 sccm and about 1000 sccm.

17. The method according to claim 1, wherein the purge gas comprises an inert gas.

18. The method according to claim 17, wherein the inert gas comprises at least one Ar, He, Kr, Xe, and $N_2$.

19. The method according to claim 1, wherein a flow rate of the purge gas is between about 50 sccm and about 1000 sccm.

20. The method according to claim 1, wherein the length of the metal-carbonyl precursor gas pulse is between about 1 sec and about 500 sec.

21. The method according to claim 1, wherein the length of the metal-carbonyl precursor gas pulse is about 25 sec.

22. The method according to claim 1, wherein time period between the metal-carbonyl precursor gas pulses in between about 1 sec and about 120 sec.

23. The method according to claim 1, wherein the time period between the metal-carbonyl precursor gas pulses is about 30 sec.

24. The method according to claim 1, wherein the substrate temperature is between about 250° C. and about 600° C.

25. The method according to claim 1, wherein the substrate temperature is between about 400° C. and about 500° C.

26. The method according to claim 1, wherein a process chamber pressure is between about 0.01 Torr and about 5 Torr.

27. The method according to claim 1, wherein a process chamber pressure is less than about 0.2 Torr.

28. The method according to claim 1, wherein a process chamber pressure is about 0.04 Torr.

29. The method according to claim 1, wherein the metal layer formed during each pulse of a metal-carbonyl precursor gas is between about 5 A and about 60 A thick.

30. The method according to claim 1, wherein the metal layer formed during each pulse of a metal-carbonyl precursor gas is between about 5 A and about 10 A thick.

31. The method according to claim 1, wherein the desired thickness of the metal layer is less than about 500 A.

32. The method according to claim 1, wherein the substrate comprises at least one of a semiconductor substrate, a LCD substrate, and a glass substrate.

33. The method according to claim 1, further comprising depositing a metal nucleation layer on the substrate.

34. The method according to claim 33, wherein the depositing comprises utilizing a process selected from at least one of CVD, PECVD, and PVD.

35. The method according to claim 33, wherein the depositing utilizes a CVD process comprising exposing the substrate to a metal-carbonyl precursor gas.

36. The method according to claim 33, wherein the depositing utilizes a CVD process employing a process chamber pressure between about 0.1 Torr and about 5 Torr.

37. The method according to claim 33, wherein the depositing utilizes a CVD process employing a process chamber pressure of about 0.5 Torr.

38. The method according to claim 1, wherein the substrate comprises a plurality of microstructures and the method further comprises:
   forming a metal layer having a first thickness on the bottom of at least one microstructure a second thickness on the sidewall of the at least one microstructure, and an overhang at the top of the at least one microstructure.

39. The method according to claim 38, wherein the width of the at least one microstructure is less than about 0.4 micron.

40. The method according to claim 38, wherein the width of the at least one microstructure is less than about 0.15 micron.

41. The method according to claim 38, wherein the width of the at least one microstructure is less than about 0.1 micron.

42. The method according to claim 38, wherein the depth of the at least one microstructure is greater than about 1 micron.

43. The method according to claim 38, wherein the aspect ratio of the at least one microstructure is greater than about 3:1.

44. The method according to claim 38, wherein the first thickness is greater than about 10 Å.

45. The method according to claim 38, wherein the first thickness is greater than about 50 Å.

46. The method according to claim 38, wherein the first thickness is greater than about 150 Å.

47. The method according to claim 38, wherein the second thickness is greater than about 10 Å.

48. The method according to claim 38, wherein the second thickness is greater than about 50 Å.

49. The method according to claim 38, wherein the second thickness is greater than about 150 Å.

50. The method according to claim 38, wherein the ratio of the first thickness and metal layer thickness adjacent to the at least one microstructure is greater than about 0.1.

51. The method according to claim 38, wherein the ration of the second thickness and the thickness of the metal layer adjacent to the at least one microstructure is greater than about 0.1.

52. The method according to claim 38, wherein the ratio of the thickness of the overhang and the thickness of the metal layer adjacent to the at least one microstructure is less than about 0.7.

53. The method according to claim 38, wherein the ratio of the thickness of the overhang and the thickness of the metal layer adjacent to the at least one microstructure is less than about 0.5.

* * * * *